United States Patent
Domenicucci et al.

(10) Patent No.: US 7,881,093 B2
(45) Date of Patent: Feb. 1, 2011

(54) PROGRAMMABLE PRECISION RESISTOR AND METHOD OF PROGRAMMING THE SAME

(75) Inventors: Anthony G. Domenicucci, New Paltz, NY (US); Terence L. Kane, Port Chester, NY (US); Michael Tenney, Poughkeepsie, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 12/185,375

(22) Filed: Aug. 4, 2008

(65) Prior Publication Data
US 2010/0025819 A1    Feb. 4, 2010

(51) Int. Cl.
*G11C 11/00* (2006.01)
*G11C 11/34* (2006.01)
*H01L 27/12* (2006.01)
*H01L 29/00* (2006.01)

(52) U.S. Cl. .......... 365/148; 365/51; 365/174; 257/347; 257/536; 257/615

(58) Field of Classification Search ........... 365/51, 365/148, 174; 257/347, 348, 536, 614, 615
See application file for complete search history.

(56) References Cited

U.S. PATENT DOCUMENTS

| | | | |
|---|---|---|---|
| 2003/0123207 A1 | 7/2003 | Toyoshima | |
| 2005/0087836 A1 | 4/2005 | Wu | |
| 2005/0124097 A1 | 6/2005 | Xiang | |
| 2005/0156258 A1 | 7/2005 | Park et al. | |
| 2005/0205934 A1* | 9/2005 | Lochtefeld et al. | 257/347 |
| 2006/0006494 A1 | 1/2006 | Wu | |
| 2007/0087496 A1 | 4/2007 | Sel et al. | |
| 2007/0262415 A1 | 11/2007 | Smith et al. | |
| 2008/0007986 A1 | 1/2008 | Jeong et al. | |
| 2008/0067629 A1 | 3/2008 | Miyashita | |
| 2008/0290413 A1* | 11/2008 | Mandelman et al. | 257/347 |

* cited by examiner

*Primary Examiner*—Ly D Pham
(74) *Attorney, Agent, or Firm*—Scully, Scott, Murphy & Presser, P.C.; Joseph P. Abate, Esq.

(57) ABSTRACT

A link portion between a first electrode and a second electrode includes a semiconductor link portion and a metal semiconductor alloy link portion comprising a first metal semiconductor alloy. An electrical pulse converts the entirety of the link portion into a second metal semiconductor alloy having a lower concentration of metal than the first metal semiconductor alloy. Due to the stoichiometric differences between the first and second metal semiconductor alloys, the link portion has a higher resistance after programming than prior to programming. The shift in electrical resistance well controlled, which is advantageously employed to as a programmable precision resistor.

10 Claims, 12 Drawing Sheets

PROGRAMMABLE PRECISION RESISTOR AND METHOD OF PROGRAMMING THE SAME

FIELD OF THE INVENTION

The present invention relates to a semiconductor structure, and particularly to a programmable precision resistor by diffusion of material, semiconductor circuits for programming the same, and methods of programming the same.

BACKGROUND OF THE INVENTION

Precision resistors are employed in semiconductor circuits including analog devices and radio frequency (RF) devices as a circuit component. Many applications require a well-defined resistance value within a narrow specification range including, for example, a tuning circuit requiring a high Q factor. However, fabrication of high precision resistors is difficult since semiconductor manufacturing processes are prone to process variations such as variations in lithographic critical dimensions and thickness variations in deposited films.

Since statistical variations in processing parameters are inherent in semiconductor devices, manufacture of a resistor having a resistance within a predefined resistance value with a narrow specification range poses a particular challenge. A prior art precision resistor structure includes a network of resistor components connected with programmable electrical fuses. However, such prior art precision resistor structures require a plurality of circuits, each including a programming transistor circuit, a programmable electrical fuse that may be programmed, for example, by electromigration, and a resistor component having a constant resistance. In such applications, the electrical fuses cannot be employed as a resistor since the variations in the programmed electrical fuse has significant statistical variation, and thus, the value of resistance of a programmed electrical fuse is not predictable. Any change in the resistance of the prior art precision resistor structures is effected by connection or disconnection of a resistor component having a constant resistance value irrespective of programming of the electrical fuse. In other words, the electrical fuses and the resistor are two distinct circuit components that are not integrated with each other. Since separate areas are required for the resistor components and electrical fuses, prior art precision resistor structures require a large circuit area.

In view of the above, there exists a need for a programmable resistor structure providing a programmable resistance with a small foot print area for semiconductor applications.

SUMMARY OF THE INVENTION

The present invention addresses the needs described above by providing a programmable precision resistor structure that changes resistance value to a predetermined level upon programming, and methods of manufacturing the same.

In the present invention, a programmable resistive structure comprises a first electrode and a second electrode, each comprising a stack of a semiconductor portion and a metal semiconductor alloy portion. The first electrode and the second electrode are connected by a link portion comprising a semiconductor link portion and a metal semiconductor alloy link portion comprising a first metal semiconductor alloy. The programmable resistive structure has a first resistance prior to programming, which may be determined primarily by the resistance of the link portion. An electrical pulse is applied through the link portion to induce diffusion of the first metal semiconductor alloy into the semiconductor material of the semiconductor link portion, thereby converting the entirety of the link portion into a second metal semiconductor alloy having a lower concentration of metal than the first metal semiconductor alloy. Due to the stoichiometric differences between the first and second metal semiconductor alloys, the link portion has a higher resistance after programming than prior to programming. Unlike electrical fuses, the resistance shift is well controlled since the fixed volume of the link portion self-limits the composition of the second metal semiconductor alloy.

According to an aspect of the present invention, a semiconductor structure is provided, which comprises:

a first electrode including a first semiconductor portion and a first metal semiconductor alloy portion and located on a substrate;

a second electrode including a second semiconductor portion and a second metal semiconductor portion and located on the substrate, wherein the first metal semiconductor alloy portion and the second metal semiconductor alloy portion comprise a first metal semiconductor alloy; and a link portion including a second metal semiconductor alloy and laterally abutting the first electrode and the second electrode, wherein an atomic concentration of metal in the second metal semiconductor alloy is less than an atomic concentration of metal in the first metal semiconductor alloy.

In one embodiment, the first metal semiconductor alloy comprises a metal and a semiconductor material, and wherein the second metal semiconductor alloy comprises the metal and the semiconductor material, and wherein an atomic concentration of the semiconductor material in the second metal semiconductor alloy is greater than an atomic concentration of the semiconductor material in the first metal semiconductor alloy.

In another embodiment, an entirety of the link portion is filled with polycrystalline grains comprising the second metal semiconductor alloy.

According to another aspect of the present invention, a semiconductor circuit is provided, which comprises:

a programmable resistor including a first electrode, a second electrode, and a link portion providing a resistance change upon programming;

at least one semiconductor device directly connected to the first electrode; and a programming transistor electrically directly connected to the first electrode and configured to flow current through the first electrode, the link portion, and the second electrode.

According to yet another aspect of the present invention, a method of changing resistance of a semiconductor structure is provided, which comprises:

providing a programmable resistor including a first electrode, a second electrode, and a link portion including a link semiconductor portion and a link metal semiconductor alloy portion comprising a first metal semiconductor alloy; and passing current through the link semiconductor portion, wherein material of the link metal semiconductor alloy diffuse into the link semiconductor portion to form a second metal semiconductor alloy having a higher resistance than the first metal semiconductor alloy.

BRIEF DESCRIPTION OF THE DRAWINGS

FIGS. 1A and 1B are views of an exemplary semiconductor structure prior to programming according to the present invention.

FIGS. 2A and 2B are views of an exemplary semiconductor structure after programming according to the present invention.

DETAILED DESCRIPTION OF THE INVENTION

As stated above, the present invention relates to a programmable precision resistor by diffusion of material, semiconductor circuits for programming the same, and methods of programming the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 1A:
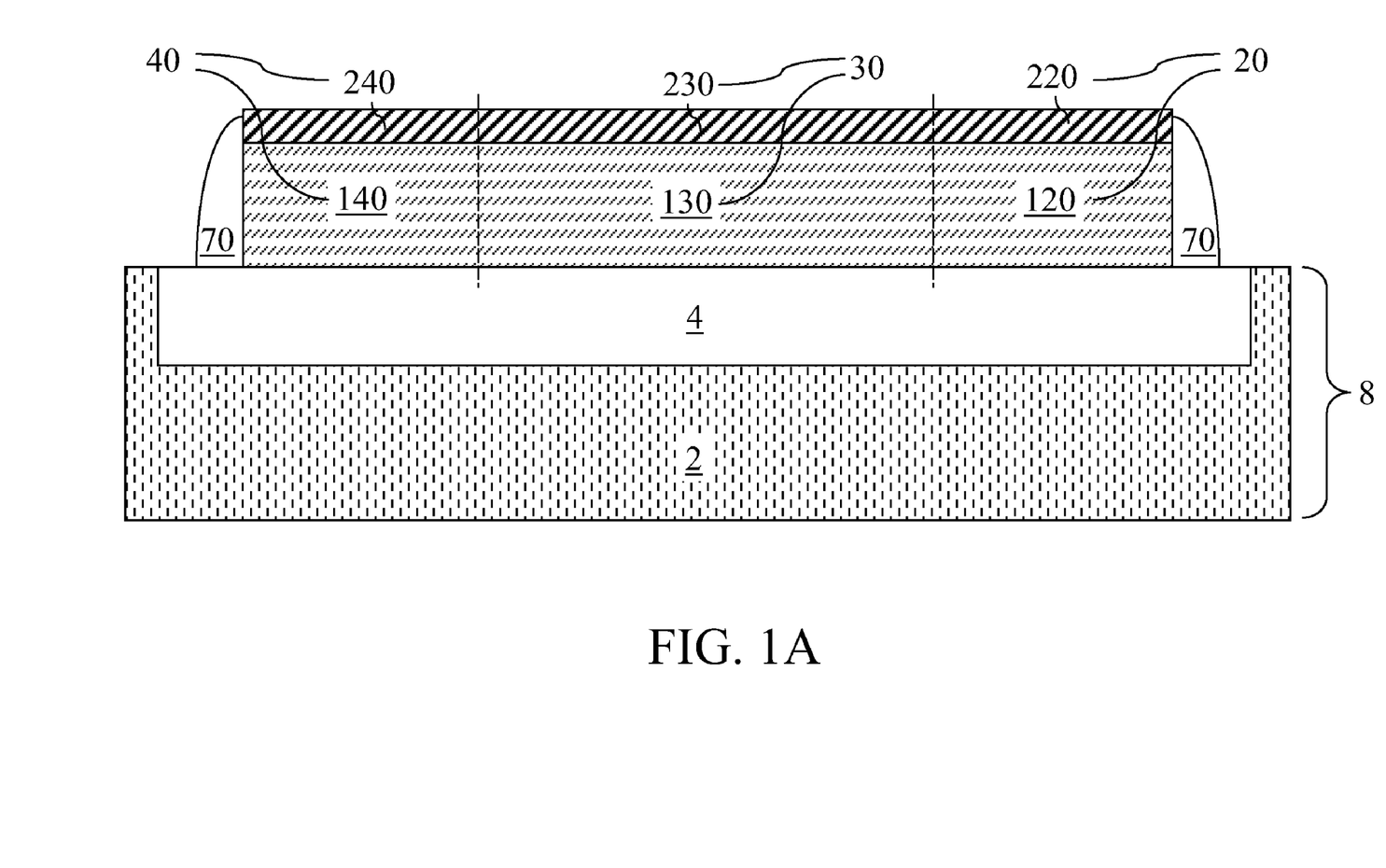
FIG. 1A is a vertical cross-sectional view of the exemplary semiconductor structure and FIG. 1B is a top-down view of the exemplary semiconductor structure.
Figure 1B:
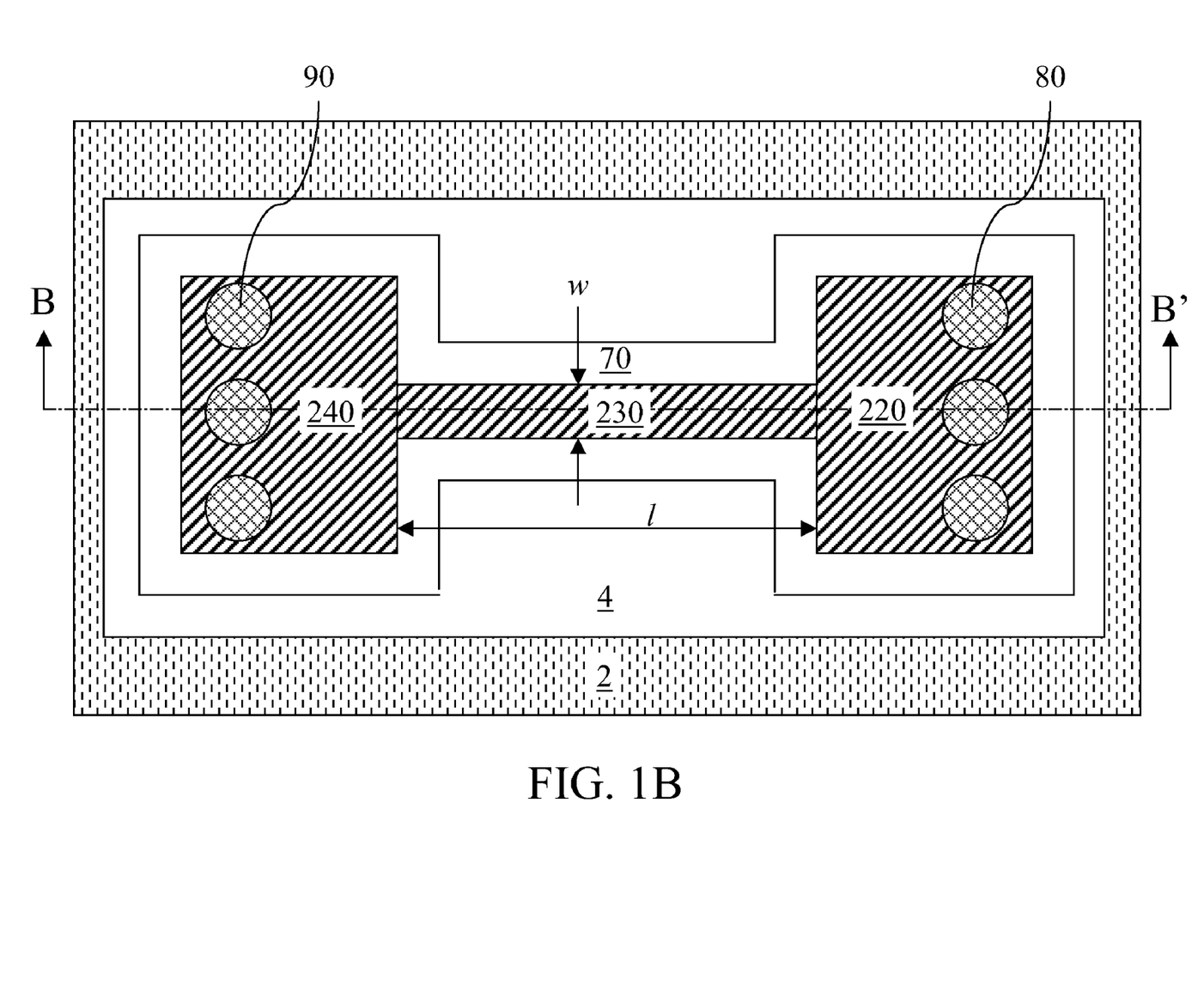

Referring to FIGS. 1A-1B, an exemplary semiconductor structure according to the present invention comprises a substrate 8 that contains a semiconductor layer 2 and an insulator region 4. The substrate 8 may be a bulk semiconductor substrate, a semiconductor-on-insulator (SOI) substrate, or a hybrid semiconductor substrate having a bulk portion and an SOI portion. Alternatively, instead of the semiconductor layer 2, the substrate 8 may comprise an insulator substrate (not shown) or a metallic substrate (not shown) containing an insulator region on a top surface thereof.

The semiconductor layer 2 comprises a semiconductor material such as silicon, a silicon containing alloy, a germanium containing alloy, a III-V compound semiconductor, or a II-IV semiconductor. Typically, the semiconductor layer 2 is single crystalline. The insulator region 8 comprises a dielectric material such as silicon oxide, silicon nitride, an insulating metal oxide, or an insulating metal nitride. The insulator region 8 may comprise a shallow trench isolation structure that provides electrical isolation between semiconductor devices (not shown) to be subsequently formed on the semiconductor layer 2. Optionally, a dielectric layer (not shown), such as a gate dielectric layer comprising a thermally formed dielectric material or a high dielectric constant (k>3.9) gate dielectric material, may be formed on a top surface of the semiconductor layer 2.

A semiconductor material layer (not shown) is formed on a top surface of the substrate 8. The semiconductor material layer may have a polycrystalline, microcrystalline, or amorphous structure. The semiconductor material lay comprises a semiconductor material, which may be one of silicon, a silicon containing alloy, a germanium containing alloy, a III-V compound semiconductor, or a II-IV semiconductor. Optionally, the semiconductor material layer may be doped with at least one electrical dopant such as boron, gallium, indium, phosphorus, arsenic, antimony, or a combination thereof.

The semiconductor material layer may be formed by chemical vapor deposition (CVD) employing a precursor containing the semiconductor material. For example, low pressure chemical vapor deposition (LPCVD), rapid thermal chemical vapor deposition (RTCVD), plasma enhanced chemical vapor deposition (PECVD), or alternating layer deposition (ALD) may be employed. In case the semiconductor material layer comprises polysilicon, the precursor may comprise silane, disilane, dichlorosilane, trichlorosilane, a silicon containing organic precursor, or a combination thereof. The thickness of the semiconductor material layer may be from about 5 nm to about 300 nm, and typically from about 30 nm to about 150 nm, although lesser and greater thicknesses are explicitly contemplated herein.

The semiconductor material layer is lithographically patterned to form a first semiconductor portion 120, a second semiconductor portion 140, and a link semiconductor portion 130. The first semiconductor portion 120, the second semiconductor portion 140, and the link semiconductor portion 130 are formed integrally. Consequently, the first semiconductor portion 120, the second semiconductor portion 140, and the link semiconductor portion 130 comprise a same semiconductor material.

A first widthwise edge of the link semiconductor portion 130 abuts the first semiconductor portion 120. A second widthwise edge of the link semiconductor portion 130 abuts the second semiconductor portion 140. Preferably, the ratio of the length l of the link semiconductor portion 130 to the width w of the link semiconductor portion 130 is at least 4 so that the thermal conduction from the link semiconductor portion 130 to the first semiconductor portion 120 and the second semiconductor portion 140. Typically, the width w of the link semiconductor portion 130 is at, or close to, a lithographic minimum dimension, i.e., a minimum dimension that may be printed by lithographic methods. Practically, the width w of the link semiconductor portion 130 may be from about 45 nm to about 120 nm, although the width w may be affected by the selection of lithography tools employed to pattern the semiconductor portions (120, 130, 140).

A dielectric spacer 70 is formed on the sidewalls of the semiconductor portions, i.e., the first semiconductor portion 120, the second semiconductor portion 140, and the link semiconductor portion 130. The dielectric spacer 70 comprises a dielectric material such as silicon oxide, silicon nitride, silicon oxynitride, or a combination thereof. The lateral thickness of the dielectric spacer 70, as measured on the top surface of the insulator region 4, may be from about 5 nm to about 150 nm, and typically from about 30 nm to about 90 nm. Typically, the lateral thickness of the dielectric spacer 70 is determined by specifications for other semiconductor devices (not shown) to be formed on the substrate 8.

A metal layer (not shown) is deposited on the semiconductor portions (120, 130, 140) for metallization of exposed semiconductor surfaces. The metal layer comprises a metal that can react with the semiconductor material of the semiconductor portions (120, 130, 140) to form a metal semiconductor alloy, which is herein referred to as a first metal semiconductor alloy. Preferably, the metal is a transition metal. Non-limiting examples of the metal include Ni, Pt, Co, Ta, Ti, W, Os, and an alloy thereof. In one embodiment, the metal is Ni, Pt, or an alloy thereof.

Preferably, the thickness of the metal layer is selected to provide a sufficient amount of metal for formation of a stoichiometric silicide. The thickness of the metal layer may be from about 5 nm to about 50 nm, and typically from about 10 nm to about 30 nm, although lesser and greater thicknesses are explicitly contemplated herein. Such a metal layer can be readily deposited by any suitable deposition technique, including, but not limited to: chemical vapor deposition (CVD), physical vapor deposition (PVD), and atomic layer deposition (ALD). The metal layer may be deposited alone, or together with a metal nitride capping layer (not shown) containing a metal nitride material such as TiN or TaN and having a thickness ranging from about 5 nm to about 50 nm, preferably from about 10 nm to about 20 nm.

In case the semiconductor material of the semiconductor portions (120, 130, 140) comprises silicon, the metal forms a metal silicide upon reaction with the semiconductor portions (120, 130, 140). In case the semiconductor material of the semiconductor portions (120, 130, 140) comprises germanium, the metal forms a metal germanide upon reaction with the semiconductor portions (120, 130, 140).

The exemplary semiconductor structure is subsequently annealed at a pre-determined elevated temperature at which the metal layer reacts with the semiconductor portions (120, 130, 140). Various metal semiconductor alloy portions are formed by reaction of the metal with the semiconductor material. Specifically, a first metal semiconductor alloy portion 220 is formed on the first semiconductor portion 120. A second metal semiconductor alloy portion 240 is formed on the second semiconductor portion 140. A link metal semiconductor alloy portion 230 is formed on the link semiconductor portion 130.

The metallization process is effected by an anneal, which is typically performed in an inert gas atmosphere, e.g., He, Ar, $N_2$, or forming gas, at a relatively low temperature ranging from about 100° C. to about 600° C., preferably from about 300° C. to about 500° C., and most preferably from about 300° C. to about 450° C., by using a continuous heating regime or various ramp and soak heating cycles. Unreacted portions of the metal layer and the optional metal nitride capping layer are removed after formation of the various metal semiconductor alloy portions. For certain metals having multiple phases of a metal semiconductor alloy, such as Co, Ti, and Ni, a second anneal may be employed to transform an intermediate metal semiconductor alloy phase to a final metal semiconductor alloy phase to increase the conductivity of the metal semiconductor alloy. Subsequently, unreacted portions of the metal layer are removed.

The first semiconductor portion 120, the second semiconductor portion 140, and the link semiconductor portion 130 comprise the same metal semiconductor alloy, i.e., the first metal semiconductor alloy. The thicknesses of the first semiconductor portion 120, the second semiconductor portion 140, and the link semiconductor portion 130 are substantially the same, and may be from about 10 nm to about 50 nm, and typically from about 15 nm to about 30 nm, although lesser and greater thicknesses are explicitly contemplated herein. The first semiconductor portion 120 and the first metal semiconductor alloy portion 220 collectively constitute a first electrode 20. The second semiconductor portion 140 and the second metal semiconductor alloy portion 240 collectively constitute a second electrode 40. The link semiconductor portion 130 and the link metal semiconductor alloy portion 230 collectively constitute a link portion 30.

A middle-of-line (MOL) dielectric layer (not shown) may be formed over the first electrode 20, the second electrode 40, and the link portion 30. The MOL dielectric layer may comprise a stack of a mobile ion diffusion barrier layer such as a silicon nitride layer and a silicon oxide based dielectric layer that may comprise undoped silicate glass (USG), fluorosilicate glass (FSG), phosphosilicate glass (PSG), or borophosphosilicate glass (BSG). The MOL dielectric layer may comprise a low-k CVD dielectric material such as a SiCOH compound or an organosilicate glass instead of the silicon oxide based dielectric layer.

At least one first metal contact via 80 is formed directly on the first metal semiconductor alloy portion 220, and at least one second metal contact via 90 is formed directly on the second metal semiconductor alloy portion 240 to provide electrical connection to the first electrode 20 and the second electrode 40, respectively.

The lateral dimensions of the first metal semiconductor alloy portion 220, the second metal semiconductor alloy portion 240, the link metal semiconductor alloy portion 230 are substantially the same as the lateral dimensions of the first semiconductor portion 120, the second semiconductor portion 140, and the link semiconductor portion 130. A first widthwise edge of the link portion 30 thus abuts the first electrode 20. A second widthwise edge of the link portion 30 abuts the second electrode 40. Preferably, the ratio of the length l of the link portion 30 to the width w of the link portion 30 is at least 4 so that the thermal conduction from the link portion 30 to the first electrode 20 and the second electrode 40.

The first metal semiconductor alloy comprises a stoichiometric or near-stoichiometric metal semiconductor alloy. In case the semiconductor material of the semiconductor portions (120, 130, 140) comprise an elemental semiconductor material Q and the metal in the metal semiconductor alloy portions (220, 230, 240) comprises an elemental metal M, the first metal semiconductor alloy has a composition of $MQ_x$, in which the value of x, i.e., the atomic ratio between the elemental metal M and the elemental semiconductor material Q, is from about 1.0 to 3.0. For example, if the first metal semiconductor alloy is nickel silicide, the value of x is about 1.0. If the first metal semiconductor alloy is cobalt silicide or titanium silicide, the value of x is about 2.0. In general, the atomic concentration of the metal in the first metal semiconductor alloy exceeds 25% irrespective of whether the first metal semiconductor alloy comprises an elemental semiconductor or a compound semiconductor.

According to the present invention, the resistance of the exemplary semiconductor structure may be altered by passing current through the link portion. Specifically, a current pulse is applied through the first electrode 20, the link portion 30, and the second electrode 40. Typically, the at least one first metal contact via 80 and the at least one second metal contact via 90 are employed to pass current through the first electrode 20, the link portion 30, and the second electrode 40. Since the first electrode 20 and the second electrode 40 have a wider width than the width w of the link portion 30, the current density in the link portion 30 is higher than the current density in the first electrode 20 or the current density in the second electrode 40. The link portion 30 is heated to a sufficiently high temperature to cause the first metal semiconductor alloy in the link metal semiconductor alloy portion 230 into the link semiconductor portion 130.

Figure 2A:
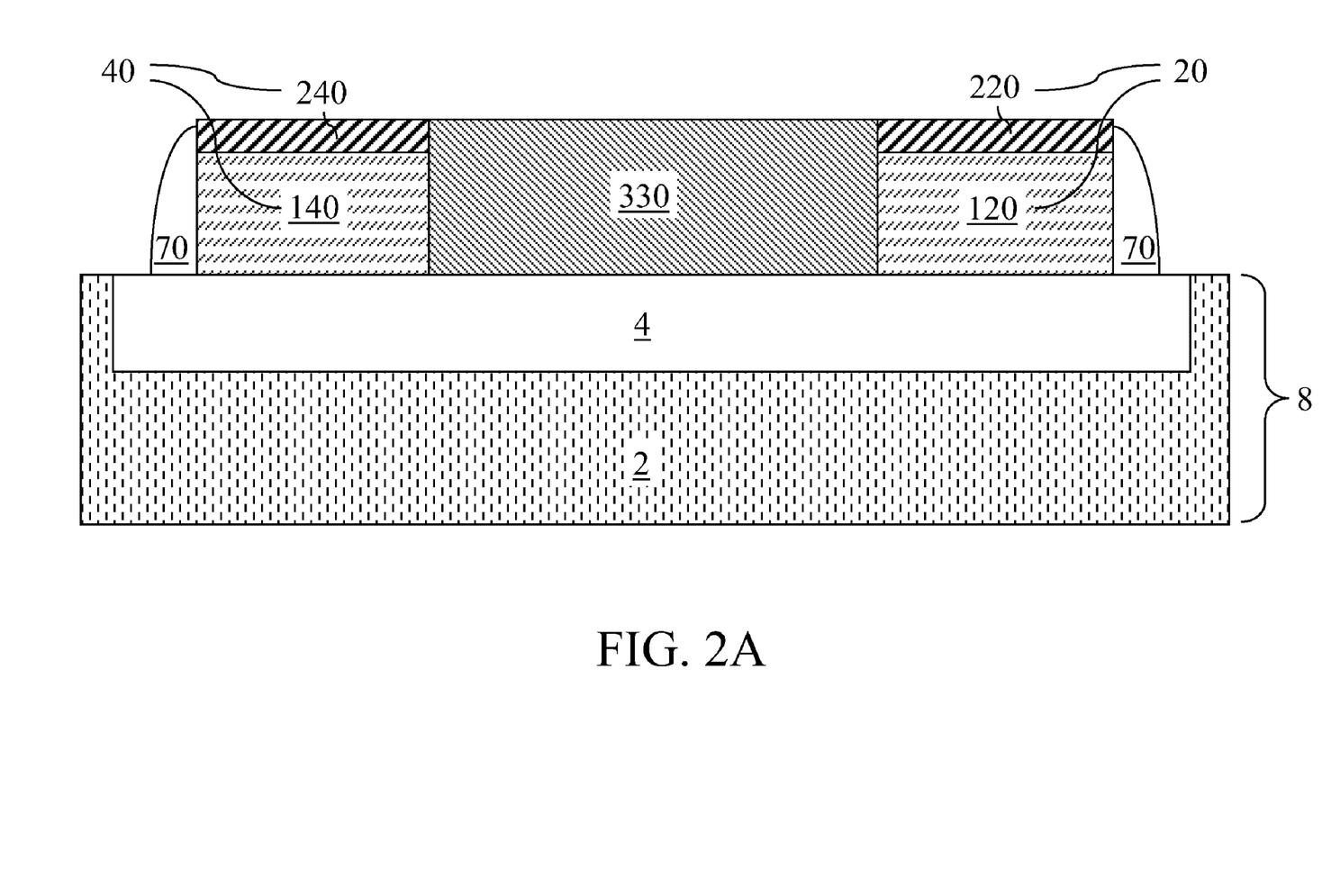
FIG. 2A is a vertical cross-sectional view of the exemplary semiconductor structure and FIG. 2B is a top-down view of the exemplary semiconductor structure.
Figure 2B:
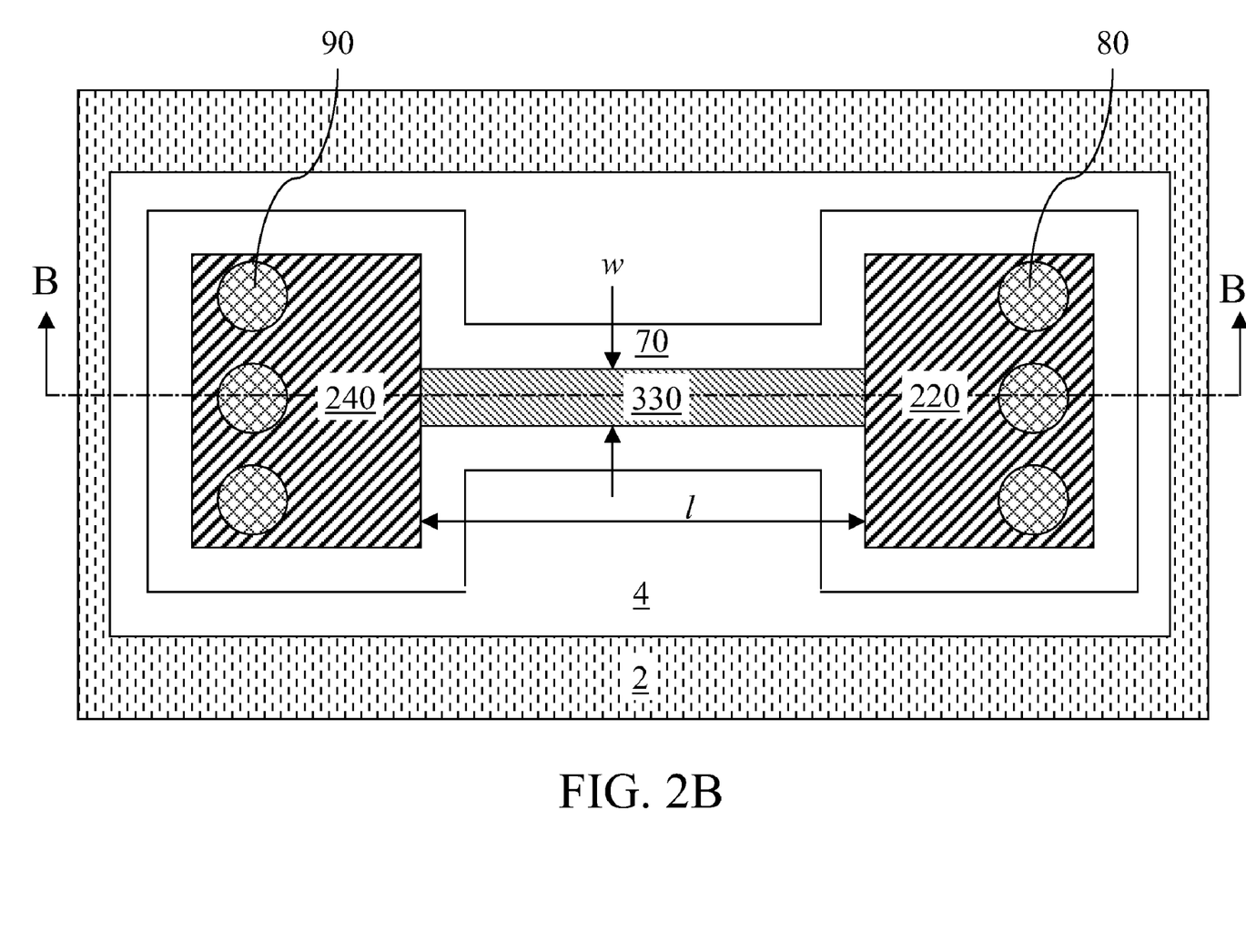

The diffusion of the first metal semiconductor alloy into the semiconductor portion 130 converts the entirety of the link portion 30 into a programmed link portion 330 having a uniform atomic composition. The material of the programmed link portion 330 is another metal semiconductor alloy having a lower metal concentration than the first metal semiconductor alloy. The material of the programmed link portion 330 is herein referred to as a second metal semiconductor alloy. The atomic concentration of the semiconductor material in the second metal semiconductor alloy is greater than the atomic concentration of the semiconductor material in the first metal semiconductor alloy. This is because the first metal semiconductor alloy is alloyed with the material of the link semiconductor portion, thereby lowering the relative metal content of the mixture and raising the relative semiconductor material content of the mixture. It is conjectured that the first metal semiconductor alloy in the link metal semiconductor alloy portion 230 rapidly diffuses into the link semiconductor portion upon heating of the link portion 30.

The chemical composition of the programmed link portion 330 is homogeneous. The structure of the programmed link portion 330 typically contains polycrystalline grains. The entirety of the programmed link portion 330 comprises the second metal semiconductor alloy. Since the first metal semiconductor alloy diffuses through the entirety of the link semiconductor portion 130, the programmed link portion abuts the insulator region 4 after programming.

The duration of the current pulse through the link portion 30 is controlled to prevent electromigration of materials in the lengthwise direction of the link portion 30. Typically, the duration of the current pulse is from about 1 nanosecond to about 1 micro second, and typically from about 3 nanosecond to about 30 nanoseconds, although lesser and greater duration of the programming current pulse is also contemplated herein. The duration of the programming pulse is limited, however, to prevent excessive heating of the programmed link portion 330 to prevent lateral electromigration of materials. Instead of electromigration, which occurs in the direction of electron flow, the mode that triggers the diffusion of the first metal semiconductor alloy into the link semiconductor portion 130 is thermal diffusion. Therefore, the transport of the material during the formation of the programmed link portion 330 is essentially vertical, and not horizontal.

Since the atomic concentration of metal in the second metal semiconductor alloy is lower than the atomic concentration of the first metal semiconductor alloy, the resistivity of the second metal semiconductor alloy is higher than the resistivity of the first metal semiconductor alloy. While the ratio of the resistivities between the first metal semiconductor alloy and the second metal semiconductor alloy may be tuned by the ratio of the thickness of the link metal semiconductor alloy portion to the thickness of the link semiconductor portion, the resistivity of the second metal semiconductor alloy is typically five to fifty times the resistivity of the first metal semiconductor alloy. Thus, the resistance of the exemplary semiconductor structure is changed by the transformation of the stack of the link semiconductor portion 130 and the link metal semiconductor alloy portion 230 into the programmed link portion 330. This change by passing of current through the link portion 30 is referred to as "programming" since the change in the resistance of the link portion 30 is capable of storing information or altering information.

The ratio of the post-programming resistance of the programmed link portion 330 to the resistance of the link portion 30 prior to programming is greater than 1.0, and is typically from about 1.5 to about 10, and more typically from about 2.0 to 4.0, although lesser and greater ratios are also contemplated herein. Since the resistance of the link portion 30 dominates the resistance of the exemplary semiconductor structure between the at least one first contact via 80 and the at least one second contact via 90, the ratio of the resistance of the exemplary semiconductor structure after programming to the resistance prior to programming is typically from about 1.5 to about 10, and more typically from about 2.0 to 4.0, also.

Figure 3:
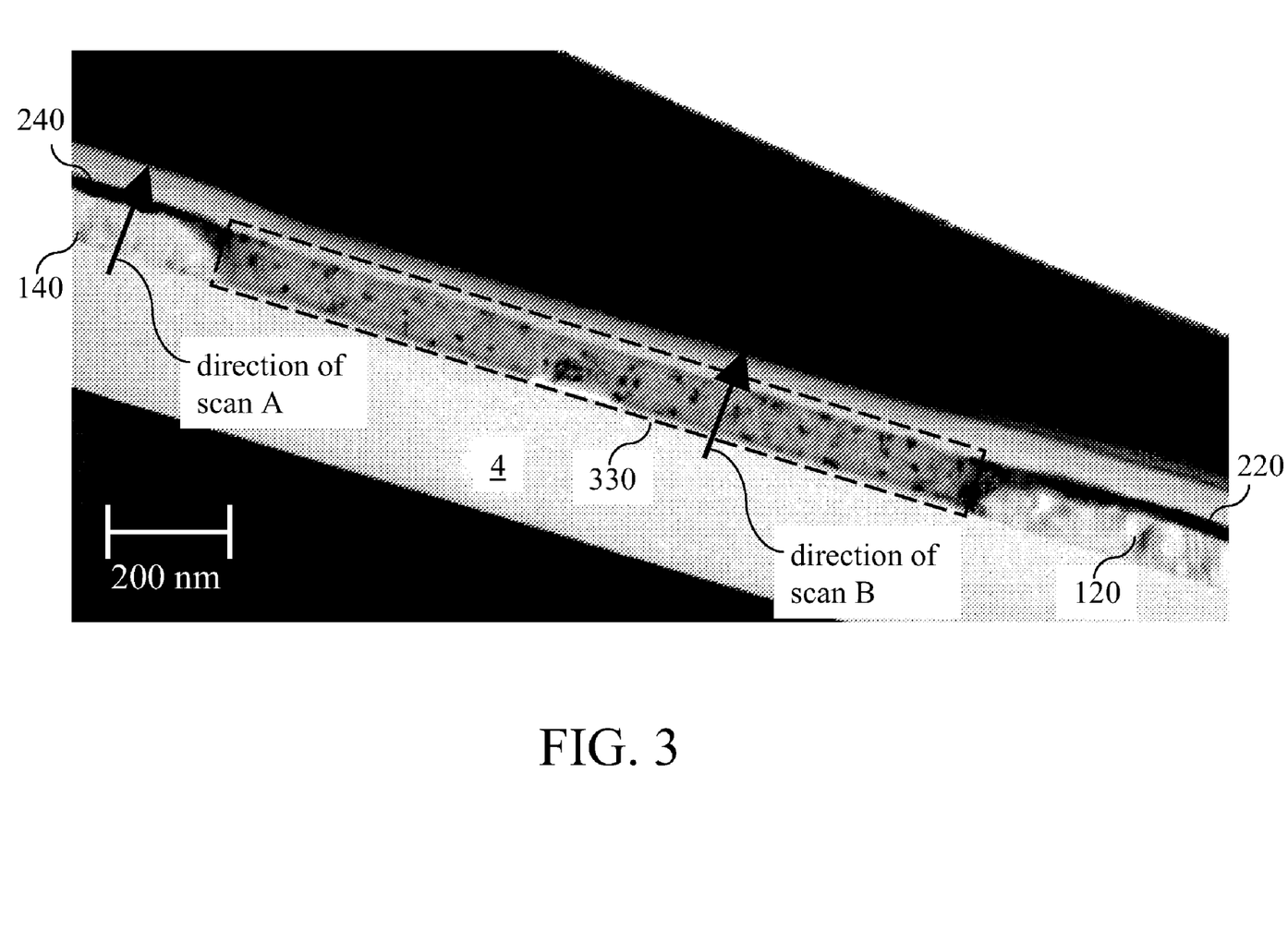
FIG. 3 is a transmission electron micrograph (TEM) of an exemplary physical semiconductor structure after programming.

Referring to FIG. 3, a transmission electron micrograph (TEM) of an exemplary physical semiconductor structure after programming is shown. In this exemplary physical semiconductor structure, the programmed link portion 330 comprises a nickel silicide, i.e., an alloy of nickel and silicon. The TEM shows the insulator region 4, the first semiconductor portion 120, the first metal semiconductor alloy portion 220, the second semiconductor portion 140, the second metal semiconductor alloy portion 240, and the programmed link portion 330 surrounded by a dotted rectangle for clarity. The programmed link portion 330 abuts the insulator region 4 since the diffusion of the first metal semiconductor alloy occurs throughout the entirety of the link portion 30 during programming.

Two elemental analysis scans were performed to ascertain the composition of the exemplary physical semiconductor structure at the surfaces shown in FIG. 3, which are described below. The direction of a first scan through the second semiconductor portion 140 and the second metal semiconductor alloy portion 240 is labeled as "direction of scan A," and the direction of a second scan through the programmed link portion 330 is labeled as "direction of scan B."

Figure 4:
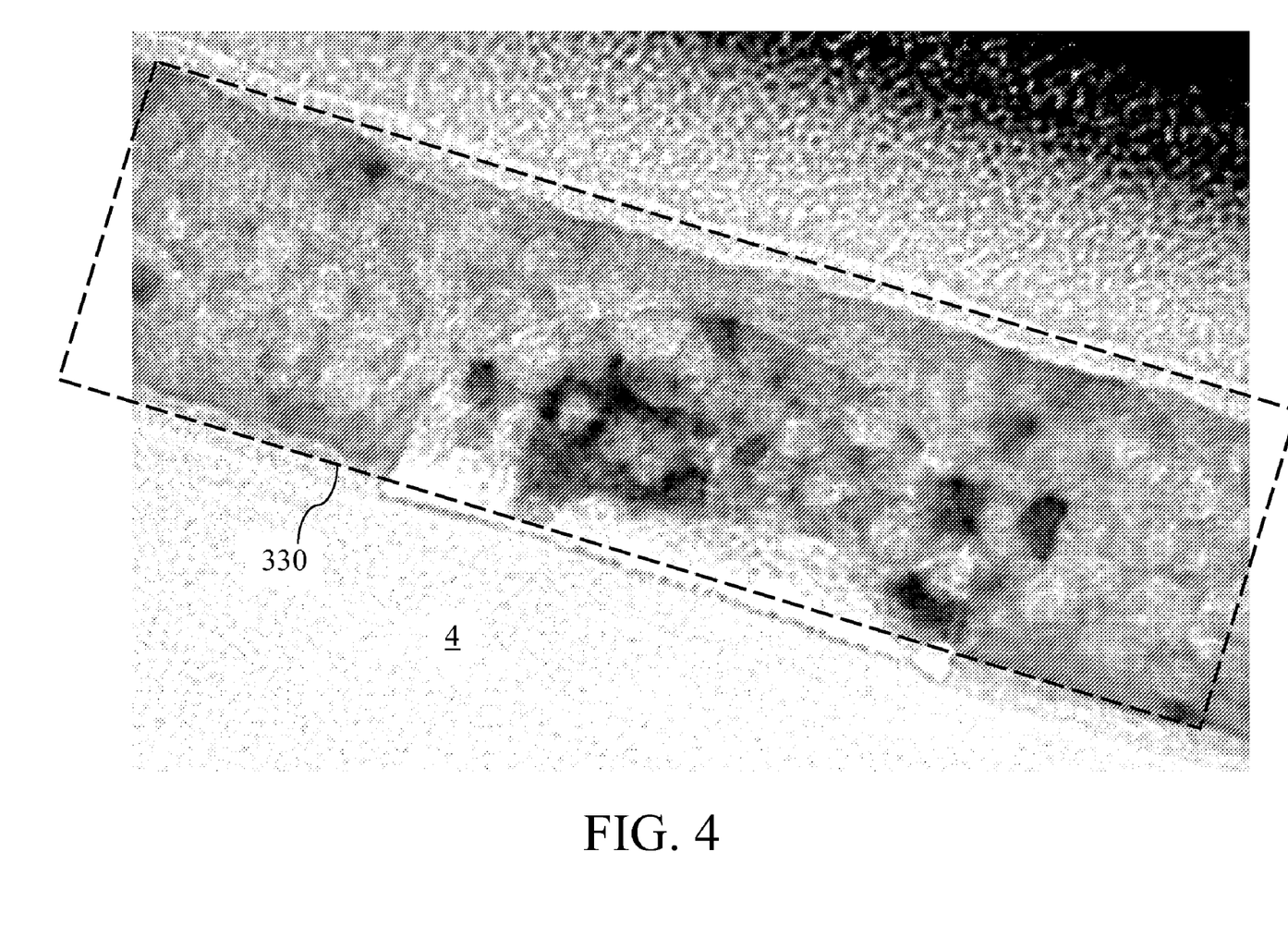
FIG. 4 is a magnified view of the TEM of FIG. 3 showing a polycrystalline grain structure.

Referring to FIG. 4, a magnified view of the TEM of FIG. 3 shows a polycrystalline grain structure in the programmed link portion 330. The entirety of the programmed link portion 330 comprises the second metal semiconductor alloy. The grain size of the programmed link portion 330 is dependent on the programming parameters, i.e., the magnitude of the programming current and the duration of the programming current, and may be from about 10 nm to about 30 nm.

Figure 5:
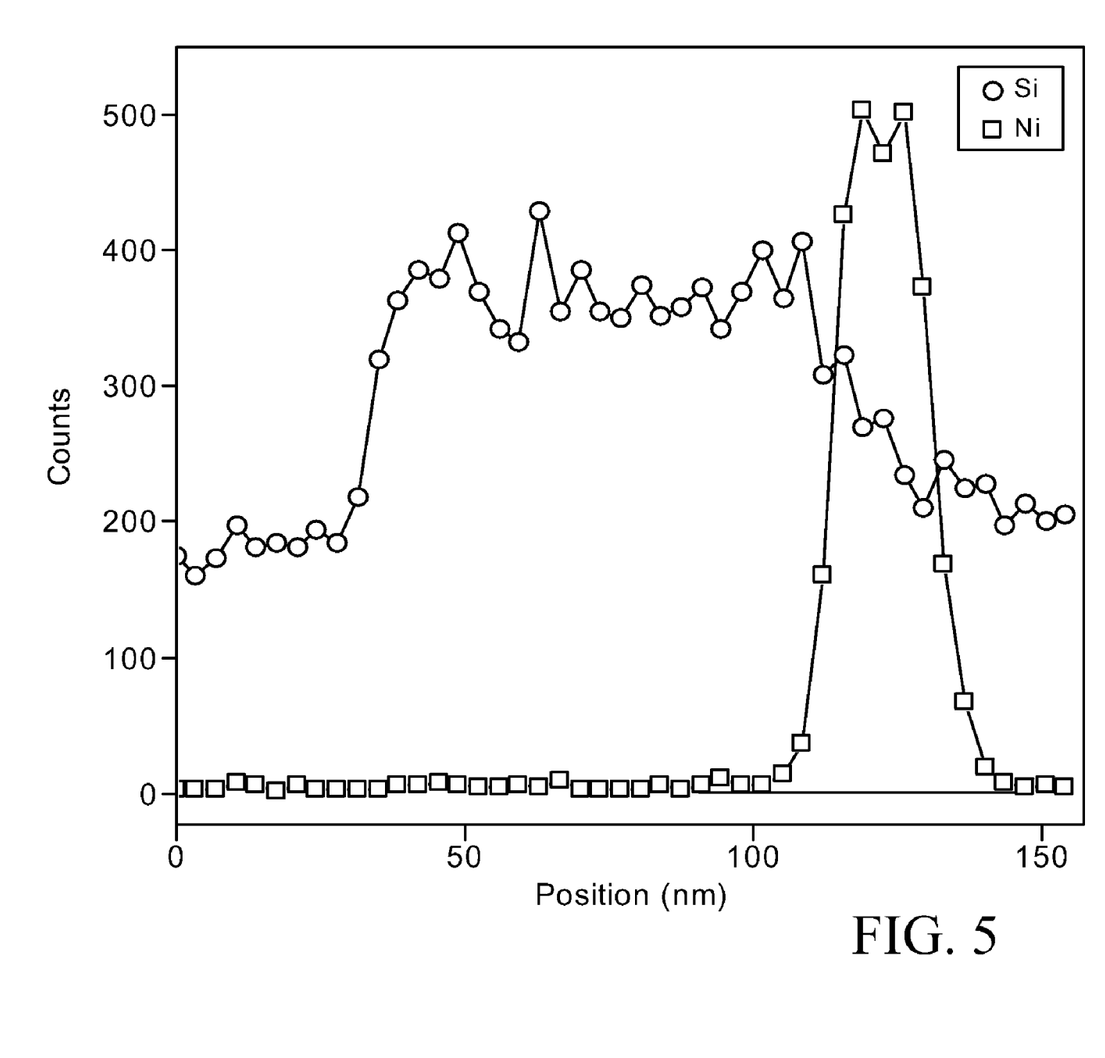
FIG. 5 is elemental analysis data along a vertical direction of an electrode of the exemplary physical semiconductor structure of FIG. 3.

Referring to FIG. 5, elemental analysis data for a first scan along the "direction of scan A" in FIG. 3 is shown. The first scan is along a vertical direction of the second electrode (140, 240) of the exemplary physical semiconductor structure of FIG. 3. The abscissa of about 30 nm corresponds to the interface between the insulator region 4, which comprises silicon oxide, and the second semiconductor portion 140, which comprises polycrystalline silicon. The abscissa of about 1,150 nm corresponds to the interface between the second semiconductor portion 140 and the second metal semiconductor alloy portion 240, which comprises stoichiometric nickel silicide, which comprises 50% nickel in atomic concentration and 50% silicon in atomic concentration, i.e., $NiSi_{1.0}$. The abscissa of about 1,300 nm corresponds to the interface between the second metal semiconductor alloy portion 240 and an MOL dielectric layer. The lack of diffusion of nickel into the second semiconductor portion 140 is evident.

Figure 6:
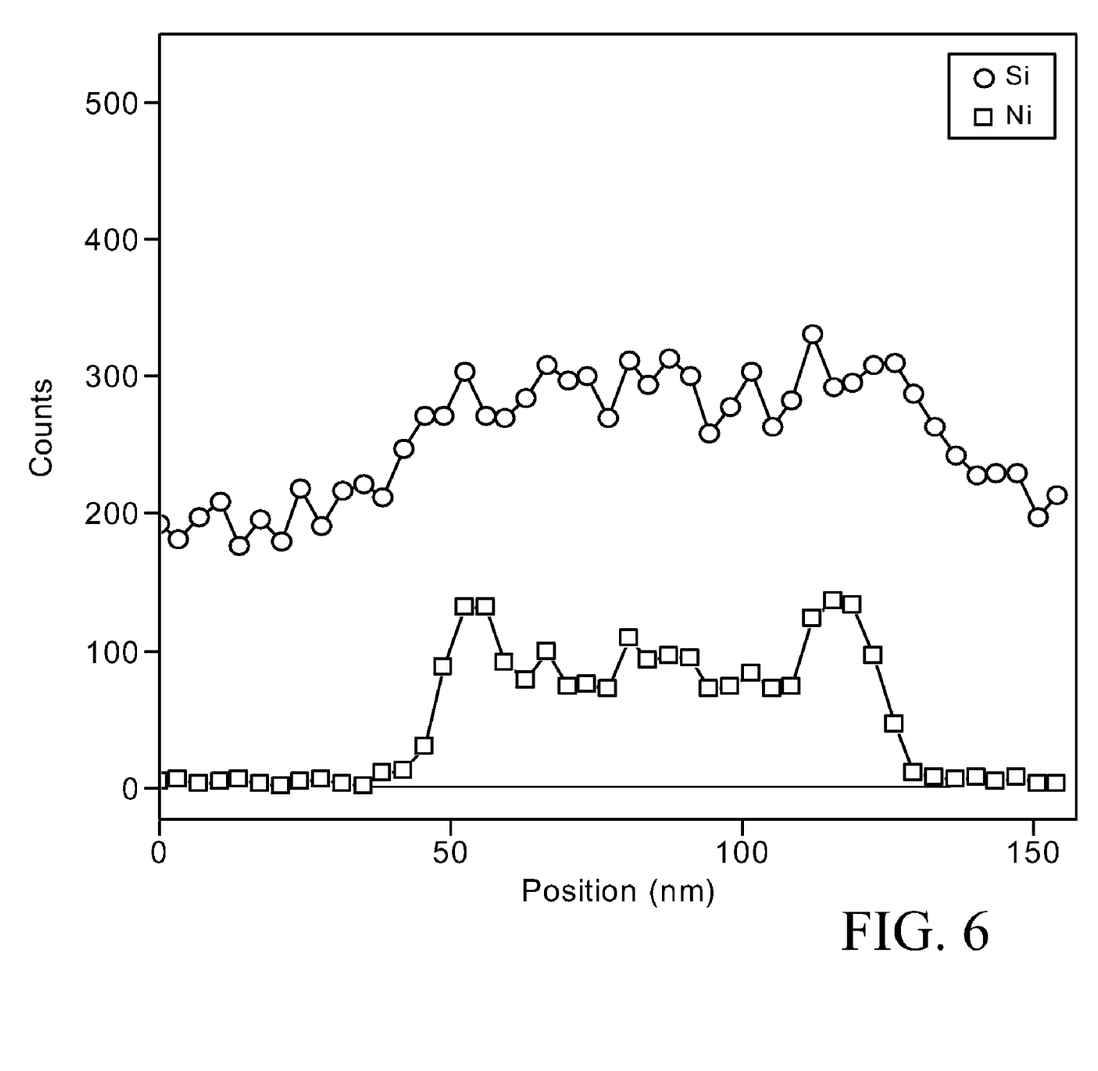
FIG. 6 is elemental analysis data along a vertical direction of a programmed link portion of the exemplary physical semiconductor structure of FIG. 3.

Referring to FIG. 6, elemental analysis data of a second scan along the "direction of scan B" in FIG. 3 is shown. The second scan is along a vertical direction of the programmed link portion 330 of the exemplary physical semiconductor structure of FIG. 3. The abscissa of about 45 nm corresponds to the interface between the insulator layer 4 and the programmed link portion 330. The abscissa of about 1,250 nm corresponds to the interface between the programmed link portion 330 and the MOL dielectric layer. The composition of nickel is substantially constant (considering the measurement error inherent in instrumentation) throughout the entirety of the scan length corresponding to the programmed link portion 330. The composition of the programmed link portion 330 is estimated to comprise about 19% nickel in atomic concentration and 81% silicon in atomic concentration, which corresponds to $NiSi_{4.25}$. The atomic concentration of the metal in the programmed link portion 330 is less than 25% in atomic concentration, representing a metal semiconductor alloy having a higher resistivity than stoichiometric metal semiconductor alloys, which have a metal at an atomic concentration greater than 25%, and typically at 33 and ⅓%, or at 50%.

Figure 7:
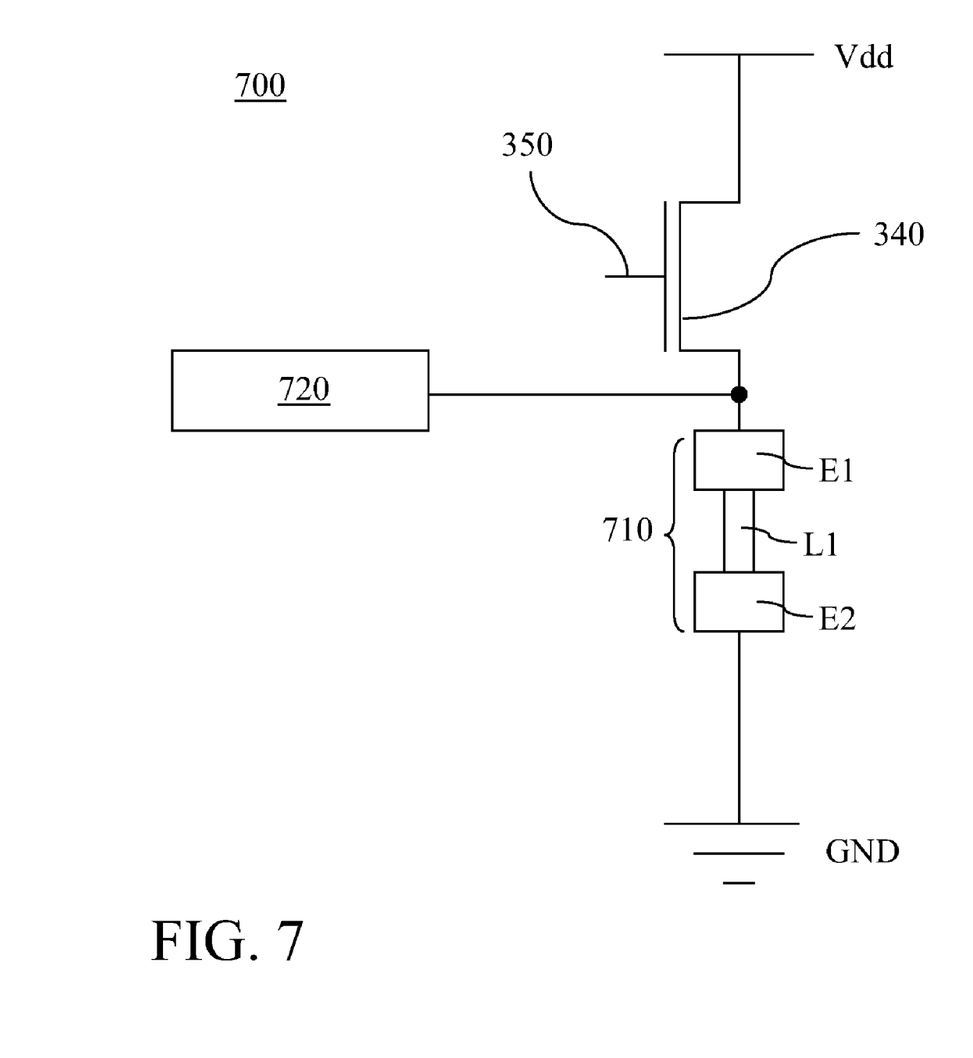
FIGS. 7, 8, 9 and 10 are schematics of first, second, third, and fourth exemplary circuits, respectively, according to the present invention.

Referring to FIG. 7, a first exemplary circuit 700 according to the present invention is shown. The first exemplary circuit comprises a programmable resistor 710 comprising a first electrode E1, a second electrode E2, and a first link portion L1 that provides a resistance change upon programming. The programmable resistor 710 may be physically implemented as the exemplary semiconductor structure of FIGS. 1A and 1B, in which the first electrode E1 corresponds to the first electrode 20, the second electrode E2 corresponds to the second electrode 40, and the first link portion L1 corresponds to the link portion 30.

The first exemplary circuit 700 further comprises a programming transistor 340 that is electrically directly connected, i.e., connected without any intervening circuit components, to the first electrode E1 and configured to flow current through the first electrode E1, the first link portion L1, and the second electrode E2. The source or drain of the programming transistor 340 that is not connected to the first electrode E1 may be connected to a power supply Vdd or electrical ground. An electrical pulse is applied to the gate 350 of the programming transistor 340 to enable passing of the current through the programmable resistor 710. Upon programming, the resistance of the programmable resistor 710 increases as described above.

At least one semiconductor device 720 is directly connected to the first electrode E1 to advantageously employ the change of resistance of the programmable resistor 710. For example, the at least one semiconductor device 720 may comprise an analog circuit generating an output that depends on the resistance of the programmable resistor 710. In this case, the programmable resistor 710 may be employed to tune the performance of the analog circuit.

In another case, the programmable resistor 710 may be employed to store information. For example, the programmable resistor 710 in an unprogrammed state may store the bit "0," and the programmable resistor 710 in a programmed state may store the bit "1."

Figure 8:
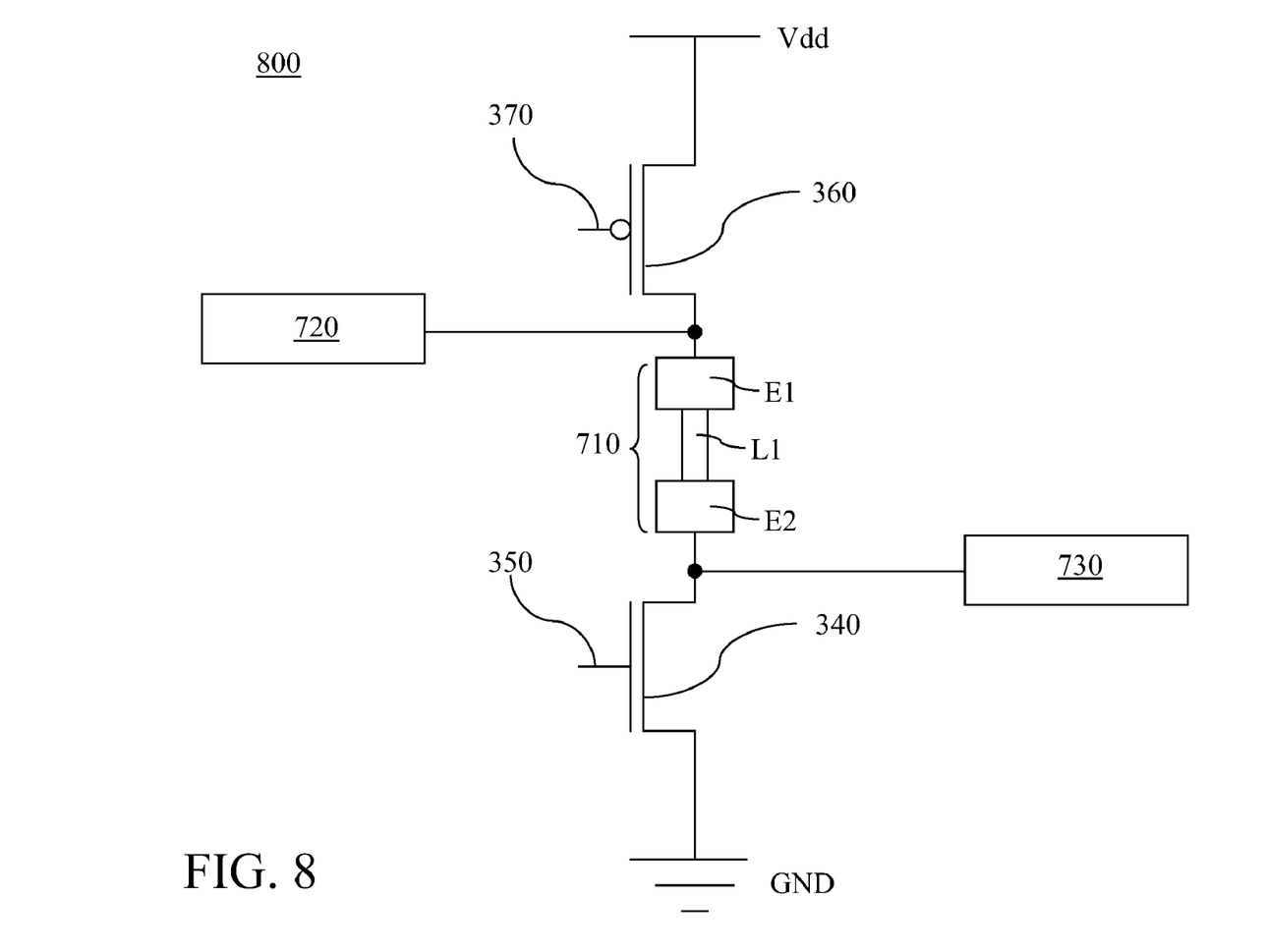

Referring to FIG. 8, a second exemplary circuit 800 according to the present invention is shown. The second exemplary circuit comprises a programmable resistor 710 as in the first exemplary circuit 700. Further, the second exemplary circuit 800 comprises a programming transistor 340 that is electrically directly connected to the second electrode E2 and configured to flow current through the first electrode E1, the first link portion L1, and the second electrode E2. In addition, the second exemplary circuit 800 comprises another programming transistor 360 that is electrically directly connected to the first electrode E1 and configured to flow current through the first electrode E1, the first link portion L1, the second electrode E2 and the programming transistor 340. The source or drain of the programming transistor 340 that is not connected to the second electrode E2 may be connected to a power supply Vdd or electrical ground. The source or drain of the other programming transistor 360 that is not connected to the first electrode E1 may be connected to electrical ground or the power supply Vdd. Temporally overlapping electrical pulses are applied to the gate 350 of the programming transistor 340 and to the gate 370 of the other programming transistor 360 to enable passing of the current through the programmable resistor 710. Upon programming, the resistance of the programmable resistor 710 increases as described above.

At least one semiconductor device 720 is directly connected to the first electrode E1 to advantageously employ the change of resistance of the programmable resistor 710. In addition, at least another semiconductor device 730 is directly connected to the second electrode E2 to advantageously employ the change of resistance of the programmable resistor 710. Prior to and after programming, the programming transistors (360, 370) are turned off to electrically isolate the power supply Vdd and electrical ground from the programmable resistor 710. The programmable resistor 710 may be employed as an electrically isolated resistor that may be programmed between two possible resistance values for circuit applications.

Figure 9:
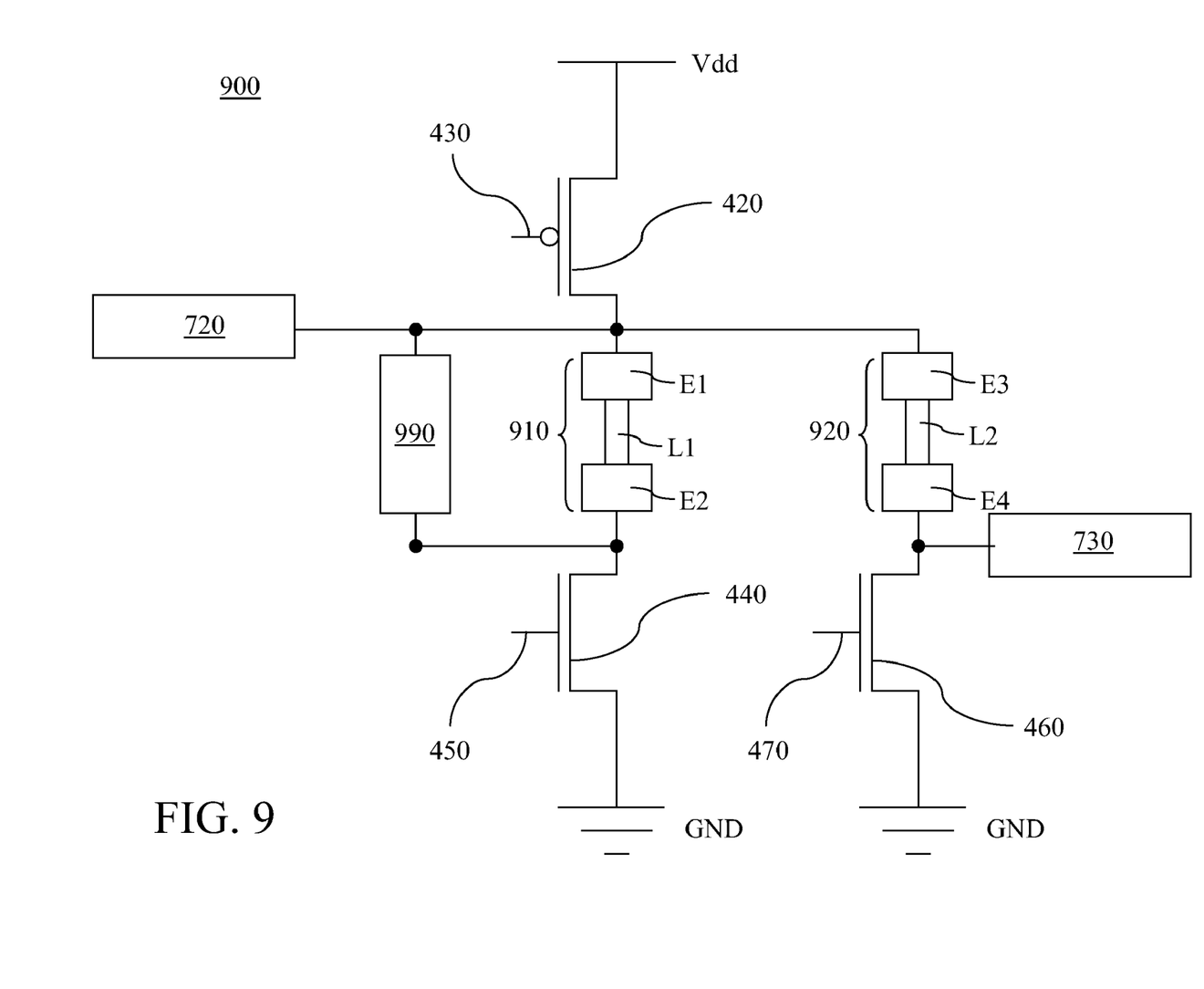

Referring to FIG. 9, a third exemplary circuit 900 according to the present invention is shown. The third exemplary circuit comprises a first programmable resistor 910 including a first electrode E1, a second electrode E2, and a first link portion L1 that provides a resistance change upon programming and a second programmable resistor 920 including a third electrode E3, a fourth electrode E4, and a second link portion L2 that provides a resistance change upon programming. Each of the first programmable resistor 910 and the second programmable resistor 920 may be physically implemented as the exemplary semiconductor structure of FIGS. 1A and 1B, in which the each of the first electrode E1 and the third electrode E3 corresponds to the first electrode 20, each of the second electrode E2 and the fourth electrode E4 corresponds to the second electrode 40, and each of the first link portion L1 and the second link portion L2 corresponds to the link portion 30.

The third exemplary circuit 900 further comprises a first programming transistor 420 that is electrically directly connected, i.e., connected without any intervening circuit components, to the first electrode E1 and the third electrode E3, and configured to flow current through the first programmable resistor 910 and/or the second programmable resistor 920. The source or drain of the programming transistor 420 that is not connected to the first electrode E1 and the third electrode E3 may be connected to a power supply Vdd or electrical ground.

Further, the third exemplary circuit 900 comprises a second programming transistor 440 that is electrically directly connected to the second electrode E2 and configured to flow current through the first programmable resistor 910 and the first programming transistor 420. In addition, the third exemplary circuit 900 comprises a third programming transistor 460 that is electrically directly connected to the fourth electrode E4 and configured to flow current through the second programmable resistor 920 and the first programming transistor 420. The sources or drains of the second programming transistor 440 and the third programming transistor 460 that is not connected to the second electrode E2 or the fourth electrode E4 may be connected to electrical ground or the power supply Vdd. Temporally overlapping electrical pulses are applied to the gate 430 of the first programming transistor 420 and to the gate 450 of the second programming transistor 440 to enable passing of the current through the first programmable resistor 910. Likewise, temporally overlapping electrical pulses are applied to the gate 430 of the first programming transistor 420 and to the gate 470 of the third programming transistor 460 to enable passing of the current through the second programmable resistor 920. The resistance of the first programmable resistor 910 increases upon programming as described above. Likewise, the resistance of the second programmable resistor 920 increases upon programming as described above.

At least one semiconductor device 720 is connected to the first electrode E1 to advantageously employ the change of resistance of the first programmable resistor 910 and the second programmable resistor 920. In addition, at least another semiconductor device 730 may be directly connected to the fourth electrode E4 to advantageously employ the change of resistance of the first programmable resistor 910 and the second programmable resistor 920. Prior to and after programming, the programming transistors (420, 430, 440) are turned off to electrically isolate the power supply Vdd and electrical ground from the first programmable resistor 910 and the second programmable resistor 920. Each of the first programmable resistor 910 and the second programmable resistor 920 may be employed as an electrically isolated resistor that may be programmed between two possible resistance values for circuit applications.

Optionally, a non-programmable resistor 990, which is a resistor having a constant resistance, may be connected to the at least one semiconductor device 720 in a series connection or in a parallel connection with the first and/or second programmable resistor (910 or 920).

Figure 10:
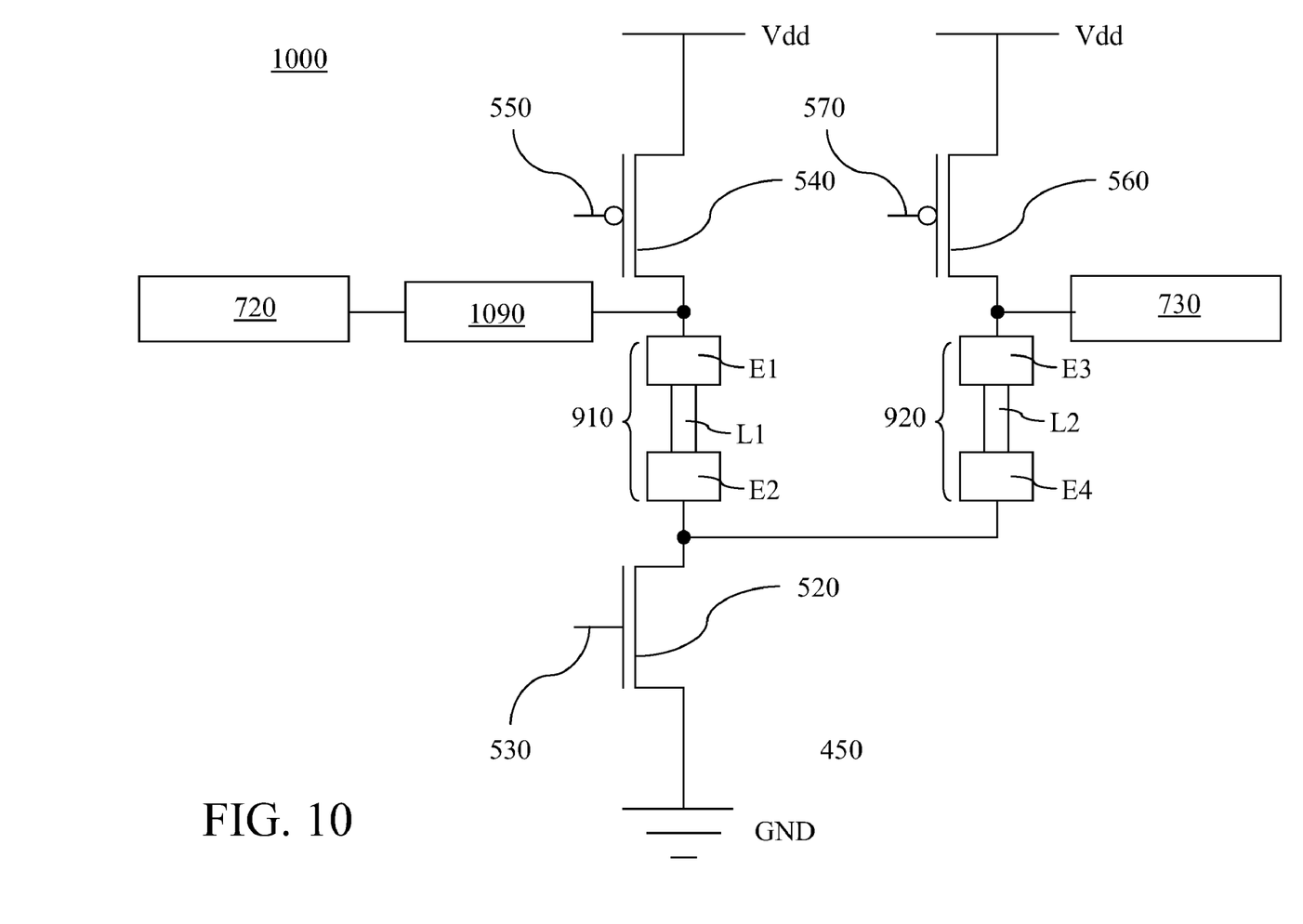

Referring to FIG. 10, a fourth exemplary circuit 1000 according to the present invention is shown. The fourth exemplary circuit comprises a first programmable resistor 910 and a second programmable resistor 920 as in the third exemplary circuit 900.

The fourth exemplary circuit 1000 further comprises a first programming transistor 520 that is electrically directly connected, i.e., connected without any intervening circuit components, to the second electrode E2 and the fourth electrode E4, and configured to flow current through the first programmable resistor 910 and/or the second programmable resistor 920. The source or drain of the programming transistor 520 that is not connected to the second electrode E2 and the fourth electrode E4 may be connected to a power supply Vdd or electrical ground.

Further, the fourth exemplary circuit 1000 comprises a second programming transistor 540 that is electrically directly connected to the first electrode E1 and configured to flow current through the first programmable resistor 910 and the first programming transistor 520. In addition, the fourth exemplary circuit 1000 comprises a third programming transistor 560 that is electrically directly connected to the third electrode E3 and configured to flow current through the second programmable resistor 920 and the first programming transistor 520. The sources or drains of the second programming transistor 540 and the third programming transistor 560 that is not connected to the first electrode E1 or the third electrode E3 may be connected to electrical ground or the power supply Vdd. Temporally overlapping electrical pulses are applied to the gate 530 of the first programming transistor 520 and to the gate 550 of the second programming transistor 540 to enable passing of the current through the first programmable resistor 910. Likewise, temporally overlapping electrical pulses are applied to the gate 530 of the first programming transistor 520 and to the gate 570 of the third programming transistor 560 to enable passing of the current through the second programmable resistor 920. The resistance of the first programmable resistor 910 increases upon programming as described above. Likewise, the resistance of the second programmable resistor 920 increases upon programming as described above.

At least one semiconductor device 720 is connected to the first electrode E1 to advantageously employ the change of resistance of the first programmable resistor 910 and the second programmable resistor 920. In addition, at least another semiconductor device 730 is directly connected to the third electrode E3 to advantageously employ the change of resistance of the first programmable resistor 910 and the second programmable resistor 920. Prior to and after programming, the programming transistors (520, 530, 540) are turned off to electrically isolate the power supply Vdd and electrical ground from the first programmable resistor 910 and the second programmable resistor 920. Each of the first programmable resistor 910 and the second programmable resistor 920 may be employed as an electrically isolated resistor that may be programmed between two possible resistance values for circuit applications.

Optionally, a non-programmable resistor 1090, which is a resistor having a constant resistance, may be connected to the at least one semiconductor device 720 in a series connection or in a parallel connection with the first and/or second programmable resistor (910 or 920).

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a first electrode including a first semiconductor portion and a first metal semiconductor alloy portion and located on a substrate;
   a second electrode including a second semiconductor portion and a second metal semiconductor portion and located on said substrate, wherein said first metal semiconductor alloy portion and said second metal semiconductor alloy portion comprise a first metal semiconductor alloy; and
   a link portion including a second metal semiconductor alloy and laterally abutting said first electrode and said second electrode, wherein an atomic concentration of metal in said second metal semiconductor alloy is less than an atomic concentration of metal in said first metal semiconductor alloy.

2. The semiconductor structure of claim 1, wherein said first metal semiconductor alloy comprises a metal and a semiconductor material, and wherein said second metal semiconductor alloy comprises said metal and said semiconductor material, and wherein an atomic concentration of said semiconductor material in said second metal semiconductor alloy is greater than an atomic concentration of said semiconductor material in said first metal semiconductor alloy.

3. The semiconductor structure of claim 2, wherein said first semiconductor portion and said second semiconductor portion comprise said semiconductor material.

4. The semiconductor structure of claim 2, wherein said metal is a transition metal.

5. The semiconductor structure of claim 4, wherein said transition metal is selected from Ni, Pt, Co, Ta, Ti, W, Os, and an alloy thereof.

6. The semiconductor structure of claim 5, wherein said transition metal is selected from Ni, Pt, and an alloy thereof.

7. The semiconductor structure of claim 1, wherein said link portion abuts said first electrode at a first widthwise edge and said second electrode at a second widthwise edge, and wherein a ratio of length to width of said link portion is at least 4.

8. The semiconductor structure of claim 1, wherein said substrate comprises an insulator region abutting said first semiconductor portion, said second semiconductor portion, and said link portion.

9. The semiconductor structure of claim 1, wherein an entirety of said link portion is filled with polycrystalline grains comprising said second metal semiconductor alloy.

10. The semiconductor structure of claim 9, wherein an atomic ratio between semiconductor material and metal in said second metal semiconductor alloy is at least 3.0.

* * * * *